United States Patent [19]

Murphy et al.

[11] Patent Number: 5,059,128

[45] Date of Patent: * Oct. 22, 1991

[54] ENGAGER MATRIX

[75] Inventors: Patrick J. Murphy, Blaine; John W. Svenkeson, Forest Lake, both of Minn.

[73] Assignee: Unisys Corporation, Detroit, Mich.

[*] Notice: The portion of the term of this patent subsequent to Jan. 29, 2008 has been disclaimed.

[21] Appl. No.: 561,393

[22] Filed: Jul. 31, 1990

Related U.S. Application Data

[60] Continuation of Ser. No. 228,895, Aug. 5, 1988, Pat. No. 4,988,305, which is a division of Ser. No. 149,827, Jan. 28, 1988, abandoned.

[51] Int. Cl.$^5$ .................. H01R 9/09; H01R 13/20
[52] U.S. Cl. .................................. 439/65; 439/74; 439/81; 439/161; 439/708

[58] Field of Search .............. 439/65, 74, 81, 161, 439/638, 708

[56] References Cited

U.S. PATENT DOCUMENTS 4,514,784  4/1985  Williams et al. ............... 439/74
4,988,305  1/1991  Svenkeson et al. ............. 439/65

FOREIGN PATENT DOCUMENTS 3005634  8/1981  Fed. Rep. of Germany ....... 439/74

Primary Examiner—Paula A. Bradley
Attorney, Agent, or Firm—John J. McCormack; Mark T. Starr

[57] ABSTRACT

A connector is disclosed for coupling pins on a printed circuit board to respective mating pins on a gate-array or like plug-in device; the connector is characterized by "floating ring" engagers based within, and adapted to resiliently couple a pair of such mating pins.

24 Claims, 23 Drawing Sheets

|  | NORMAL FORCE GRAMS F | MAX STRESS S PSI |
|---|---|---|
| NOMINAL | 114 | 79,000 |
| WORST CASE LOW | 54 | 51,000 |
| WORST CASE HIGH | 208 | 109,000 |

*FIG. 21*

RING MATERIAL:
  BE CU C172
  1/4 HT Y.P. = 150,000 PSI MIN $H = .011 \pm .001$
$B = .009 \pm .001$
$R = .019$
$L = .055$
$Y = .007 \pm .002$ (DEFLECTION)
$E = 19 \times 10^6$ $$Y = \frac{2 FR^3}{EI} \times \left(9\left(\frac{L}{R}\right) + 15\right)$$

$$S = \frac{HYE}{R^2\left(12\left(\frac{L}{R}\right) + 19.9\right)}$$

$$I = \frac{BH^3}{12}$$

FIG. 22

ENGAGER MATRIX

This application is a continuation of Pat. application U.S. Ser. No. 228,895, filed 8/05/88, now U.S. Pat. No. 4,988,305, which, in turn, is a division of Ser. No. 149,827, filed Jan. 28, 1988., now abandoned.

This relates to connector means and more particularly to miniaturized connector means adapted to provide a connection between a printed circuit board and one or more plug-in devices, such as high density pin grid array.

BACKGROUND, FEATURES

Workers in the art of designing and/or using printed circuit boards recognize that there are many problems associated with mounting plug-in devices on the boards to be in electrical connection therewith. At times (in simplest form) the male pins for devices, such as device D in FIG. 1, are simply soldered into a plated female hole contact, (e.g. like contact f-c' in printed circuit board P.). More usually, and in the more complex situations, an intermediate connector means is employed, e.g., like connector assembly C in FIG. 1. Connector C will be recognized as comprising a plastic housing with an array of female contacts f-c dimensioned and positioned to receive male pins mp of one or several devices D in conductive (removable) engagement. Connector C will itself typically present connector means such as projecting connector pins c-p which may in turn be mounted in associated printed circuit board PB (note solder joints S fused around pins c-p). In such an instance the female-male connectors of assembly C are soldered to the PC board PB, then the male pins of header D are mated to contacts f-c.

Thus, the cross-section shown in FIG. 1 illustrates a typical pin grid array (PGA) connector known to workers today (female-male type). Workers appreciate the limitations of such a PGA connector, for instance, presenting an undesirably low pin density and an undesirably high profile, or height (see height Ht typically about 360–400 mils). Typical pin density is a 0.1 by 0.1 inch grid.

To scale-down this design to accommodate a higher density pin grid (0.05 by 0.05 inches now), conventional connectors—when designed to accommodate state of the art manufacturing tolerances—are commonly 0.3 inches or more in height, with a current-conducting path length $L_c$ which is necessarily greater than their height (e.g. as with spring contacts f-c in FIG. 1—and unlike our invention e.g. as in FIG. 2A). This length $L_c$ must be minimized in an effective high speed circuit, or else the impedance along this path must be controlled. Reliability is commonly compromised, at such high pin density, the pins must become small and fragile—and so cannot sustain enough pin-mating force to break through the corrosion that typically forms on the contacts.

It is an object of this invention to provide a superior connector of the "two-faced-female" type, presenting a smaller height (lower profile; e.g. about 0.2" in some cases), accommodating a higher pin grid density (e.g. on the order of 0.05 by 0.05 inches or less), as well as having greater pin mating force to break through such corrosion (e.g., need for the order of 100 grams nominal force, 85 grams minimum; vs. the more typical 30 grams nominal, 20 grams minimum force with typical known comparable pins and connectors today).

Workers realize that a "low profile" typically reduces conductive path length and introduces associated impedance mismatch, thus accommodating high speed devices.

Workers will also recognize that a connector C as in FIG. 1 is relatively costly and complex, requiring complex stamped parts such as the female contacts f-c (which involve low-spring-force connectors which are necessarily long) and which can give rise to impedance mismatch with high frequency high speed circuits. They also involve connections for pins mp with contacts f-c characterized by as few as one or two "point-contacts"; such point-contacts can be interrupted, giving rise to a break in the electrical circuit involved (e.g., interposition of corrosion, dirt or the like on one or both sides of a pin in a female contact, as workers recognize). For increased reliability such contact-corrosion or interruption must be avoided, or broken-through; otherwise intermittent circuit interruption results.

Another very serious defect is that when conventional contacts are soldered to a PC board, the unit becomes impractical to rework or field-fix (soldered connections should be avoided for this reason). Another object of this invention is to avoid the above difficulties and accommodate rework and field-fix, while avoiding soldered connections. Workers disfavor soldered connections when working with large pin arrays because of "hidden" solder joints—these can't be visually inspected, thus their integrity/reliability remains in question. Removal or rework of a pin grid array is difficult.

The present invention further avoids circuit interruption from interposed dirt or corrosion, etc., by featuring self-wiping contacts and contacts featuring "three-point ohmic connection". The connector of the subject invention is also adaptable to virtually any design of PC boards or plug-in device.

The invention also preferably involves a connector characterized by low insertion force LIF in one case and a zero insertion force ZIF in other cases. In many instances, LIF is achieved by mating only one-half the male pins at a time (with female contacts—the first half entering with ZIF).

In a preferred feature, connectors according to this invention involve insertion of pins from the plug-in devices on one side and from the PC board on the other side—with lateral resilient ohmic gripping means engaging paired ones of these (PC/plug-in) pins. This gripping means is adapted to be resiliently spread by insertion of such paired pins (at least one thereof) and to urge the pins against one another, in ohmic wiping contact with one another and with the gripping means. This gripping means preferably involves one or several resilient contact-segments, and, in a particular preferred case, takes the form of an open-ring-clip with extended lever arm (e.g., see FIGS. 5, 6 and 7 described below).

Workers are also aware of the problem of "creep", whereby a surrounding plastic housing supporting a metallic female contact, like f-c, is at times thrust outward and away from its reference support position. "Creep" is caused by reaction forces from a female contact as transmitted to a surrounding plastic support. Such creep is exaggerated in high temperature environments and is common in ZIF connectors.

In a variation of FIG. 1, a manually operable cam means is also provided to force-open such female contacts until the associated male pins are inserted with zero force (ZIF) therein, whereupon the cam means is "moved", allowing the resilient contacts to close tightly against their pins.

It is an object hereof to address at least some of the afore-suggested problems, provide at least some of the afore-referenced features, and in general provide improved connector means.

BRIEF DESCRIPTION OF THE DRAWINGS

These and other features and advantages of the present invention will be appreciated by workers as they become better understood by reference to the following detailed description of the present preferred embodiments which should be considered in conjunction with the accompanying drawings, wherein like reference symbols denote like elements:

FIG. 7 shows a less preferred variant of the ring in FIG. 5, while

FIGS. 11-19 show an alternate connector embodiment, given in sectional schematic view in FIG. 13, with FIGS. 11, 18 showing a first layer thereof in various plan views, with a superposed second sheet similarly shown in FIG. 17 and a superposed third sheet similarly shown in FIGS. 14, 15, 16, 18 and 19, and with FIG. 12 indicating an enlarged plan view of a pair of exemplary pin bores; and modified connector rings therefor are shown in:

The invention will be better appreciated by workers upon consideration of the following detailed description of some preferred embodiments.

DESCRIPTION OF PREFERRED EMBODIMENTS

General Description, background

FIGS. 2-8 illustrate various connector and connector-ring embodiments constructed according to principles of this invention.

These, and other means discussed herein, will generally be understood as selected, formulated, made and operating according to preferred modes presently known in the art, except where otherwise specified. And, except as otherwise specified, all materials, methods, and devices and apparatus herein will be understood as implemented by known expedients according to present good practice.

PREFERRED EMBODIMENT (FIGS. 2-7)

Figure 2:
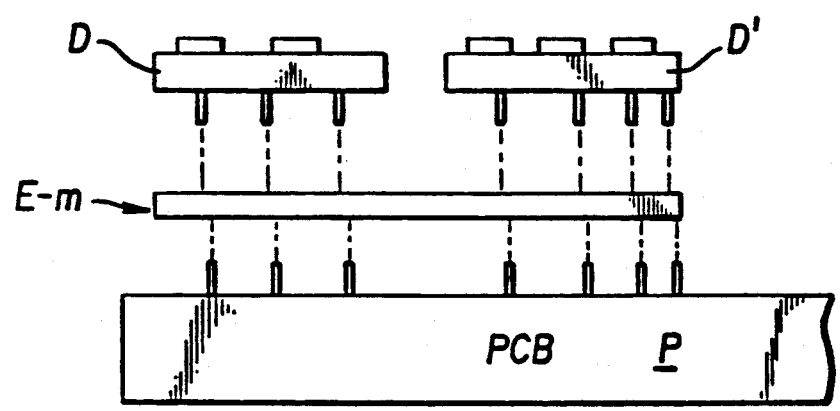
FIG. 2 is a generalized schematic elevation of a preferred connector embodiment; shown somewhat enlarged in FIG. 3, and even further enlarged in FIGS. 2A and 3A, with a more preferred connector embodiment shown exploded apart in FIG. 2B and in section in FIG. 4.

FIG. 2 indicates a very generalized view of one use of preferred connector embodiment, namely connector 1, adapted to connect a prescribed printed circuit board P with plug-in devices D, D' which may comprise the well known integrated circuit "gate arrays" or the like. Board P may comprise many laminated layers (e.g. 40 or so), and be attachable to many dozens of gate arrays (e.g. 50-100).

Figure 2A:
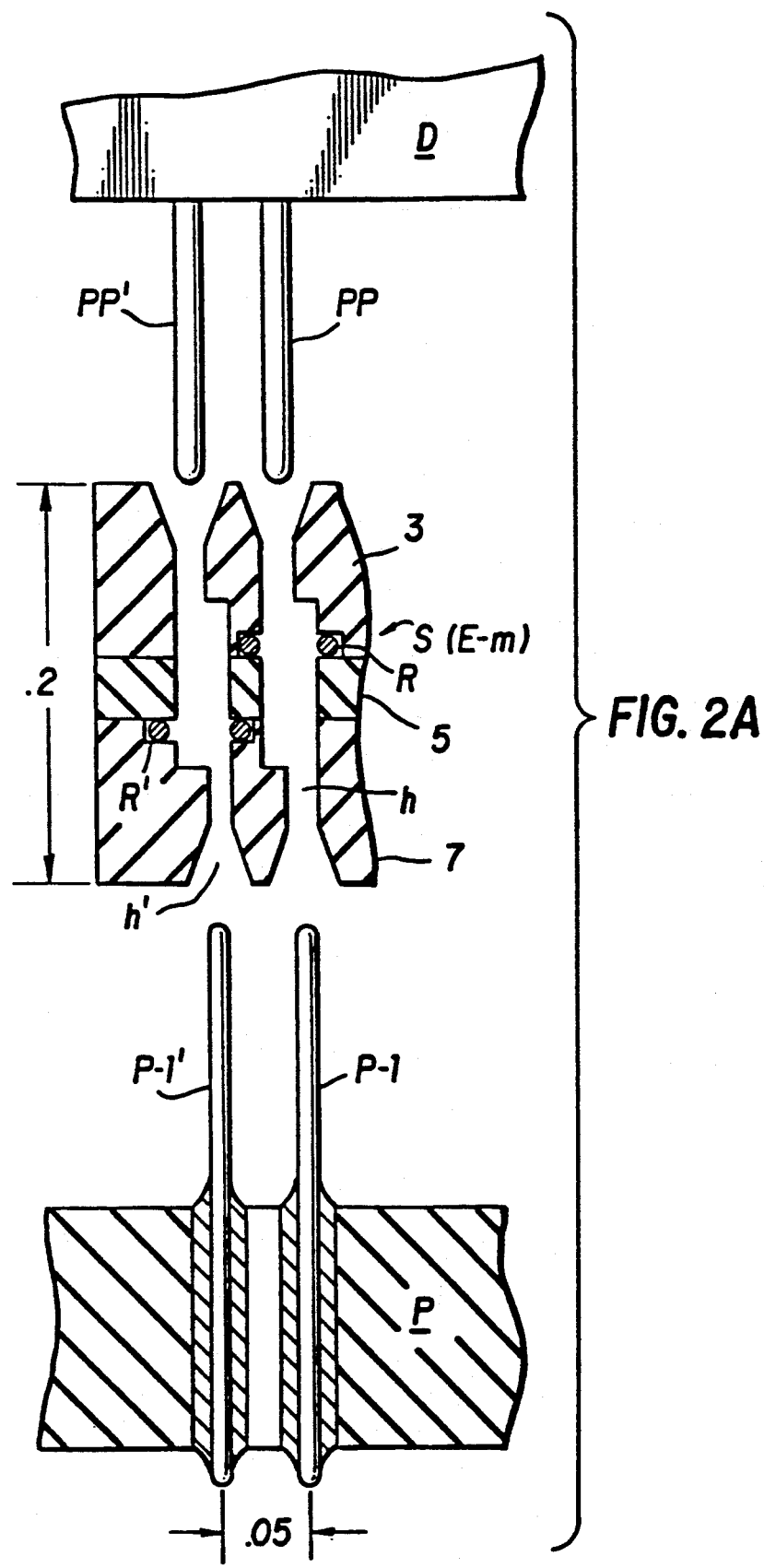
FIG. 2C showing the connector in exploded relation with a PCB and Gate Array.
Figure 2B:
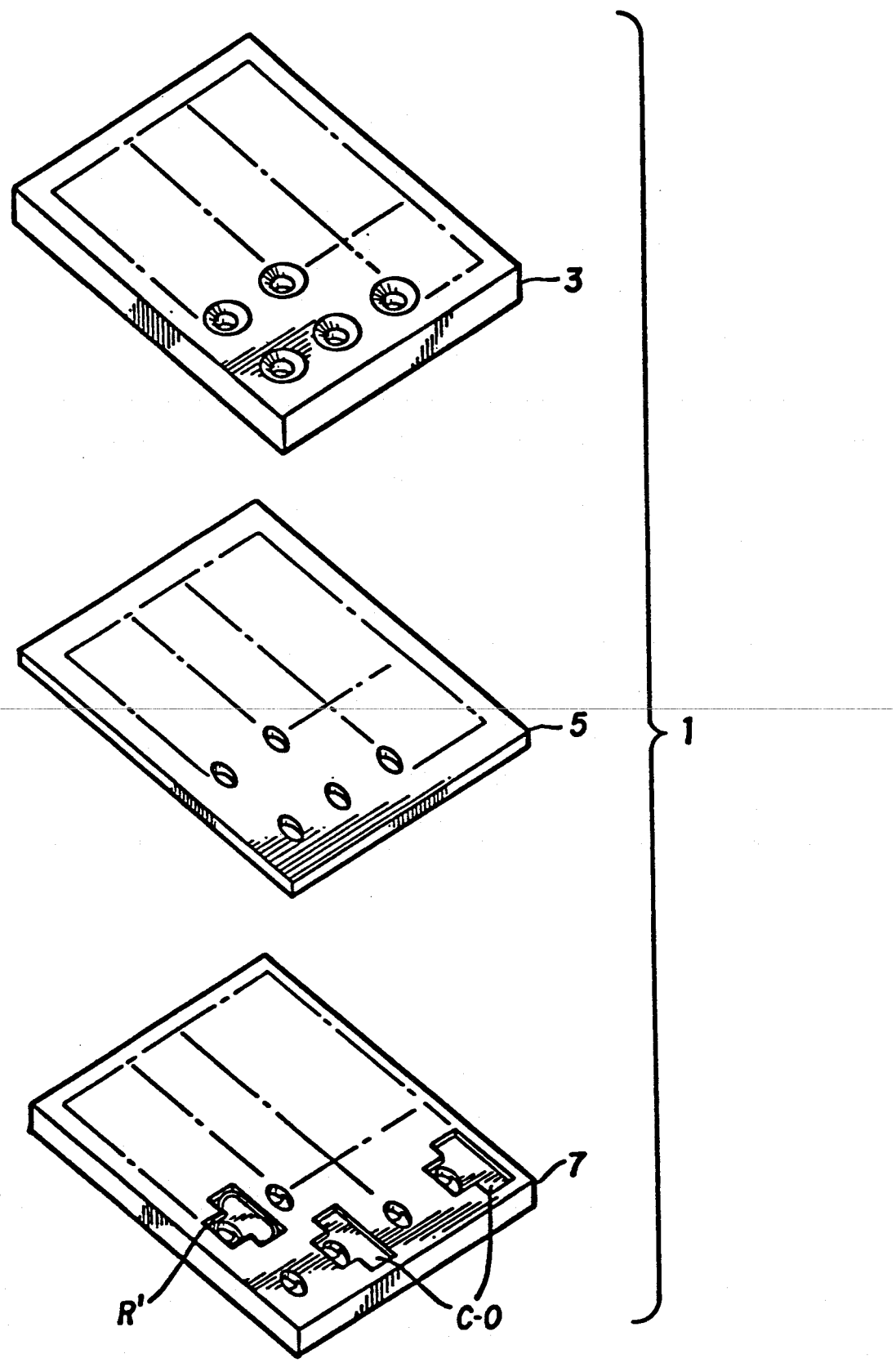
Figure 2C:
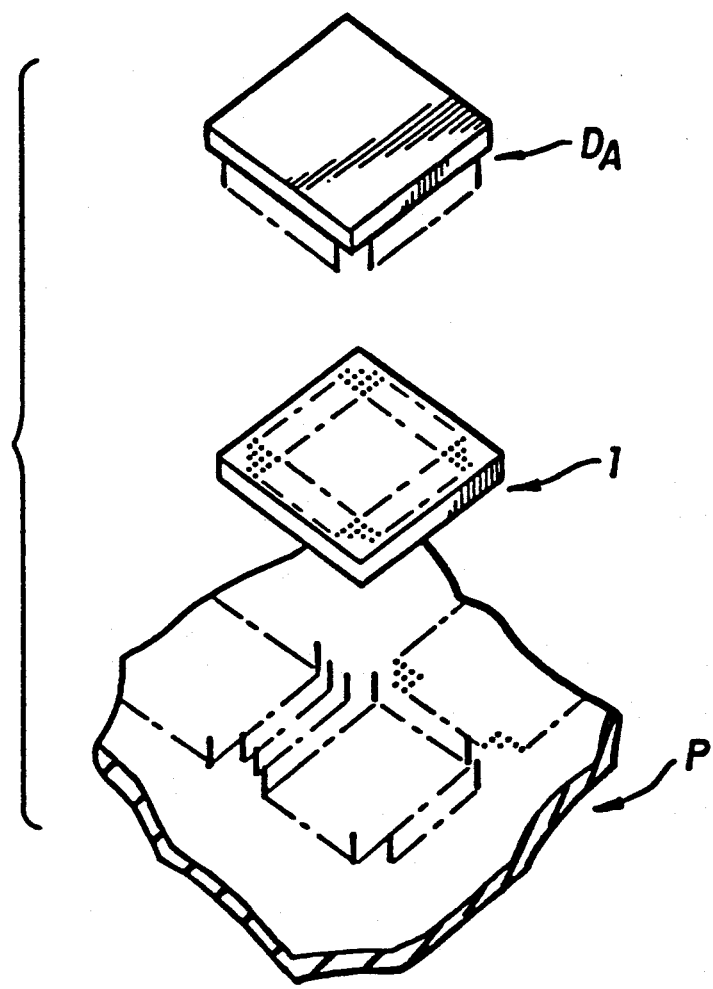

FIG. 2B is a schematic perspective of connector unit 1 showing upper layer 3 and lower layer 7 exploded-away from medial layer 5, in which are cut-outs c-o adapted to receive contact-rings R, R' (one ring R shown). In this embodiment novel connector 1 may be characterized as a "Two-faced-female" engaging means E-M accepting the male pins on plug-in devices (headers) D, D', as well as male pins projecting from PC board P, as known in the art. Note that devices (headers) D can comprise almost any chip or a multi-chip package, or a daughter board, etc.

In general, our engagement means E-m may be understood as adapted to resiliently engage mating pins ($P_d$) from a device D and board P (pins $P_p$)—and preferably is conductive and "floating" to allow a "first-entering" pin (e.g. the most fragile) to enter with little or no insertion force $F_i$, while being resiliently spread by entry of the "second-in" pin which is thus forced, wipingly against this means E-m and against the companion pin. Engagement means E-m is also preferably of minimal height to facilitate simple placement and retention in connector 1 and to keep the height of connector 1 minimized as well as minimizing, if not eliminating, any added conductor length between pins. More preferably, means E-m is also adapted to facilitate a three-point contact between itself and its pins. Also, means E-m will preferably accommodate a relatively high insertion force $F_i$ for the "second-in" pin (e.g. enough to break through a corrosion film, and afford aggressive pin-wiping; e.g. order of 85-100 gms minimum is often desired). Means E-m is also preferably small enough to accommodate high-density pin arrays (e.g. about 50×50 mils).

Connector 1 may, for instance, be the order of about 0.2 inches high (minimum 0.15 to 0.17) and may be adapted for a pin density on the order of 0.05 inches by 0.05 inches (this is four times today's typical minimum pin density of 0.1 by 0.1 inches).

FIG. 2A is an enlarged partial section of FIG. 2 focusing on two mating pins thereof P-1, P-1' projecting from board P (e.g., pins about 10 mils in diameter and on 0.05 inch centers). With the higher pin densities on a PCB, 10 mils is about all the room there is left for pin diameter in many cases. But a 10 mil pin is very weak and fragile and should be inserted with zero force if possible—the invention accommodates this.

Thus, printed circuit board P may be understood as presenting pins $P_p$ (e.g. P-1, P-1' shown) to be inserted into connector 1, each into an associated hole therein to be conductively engaged with a mate-pin from a device D (e.g. pin P-1 into hole h to mate with pin pp of device D and pin P-1' into hole h' to mate with pin pp', etc.). According to a feature hereof, this engagement is effected and facilitated by a respective engagement means disposed along a respective hole (e.g. "floating rings" R, R' in holes h, h' shown).

It will become apparent, as one feature of connector 1, that each of the pins PP, PP' of plug-in device D is "paired" with a pin P-1, etc. of board PC, being adapted to be thrown into sliding conductive contact with it and held there by the resilient engagement means (rings) secreted (seated) within connector 1—e.g., pins P-1, P-1' are to be first inserted up into respective holes h, h' of connector 1 until fully seated therein, with these pins extending well above the level of upper ring R in connector 1; thereafter, header or plug-in device D is thrust toward connector 1 so that its pins PP, PP' (e.g., can be 20 mils in diameter) are thrust into respective holes h, h', whereupon each pin PP, PP' spreads-open its resilient ring (R or R') and is thrust wipingly alongside its respective paired pin P-1, etc. from the PC board. Thus, with pin P-1 already seated in hole h, header pin PP will be inserted to be wiped along a side of P-1, while also camming (spreading) ring R apart (thrusting the near-side of R away from its opposing side which engages P-1). And device D, etc. is then further inserted scraping others of its pins (PP., etc.) alongside paired pins P-1', etc. until fully seated. Thus, the two-pin-receiving holes (h,h', etc.) can be very close (e.g. 50 mils center-to-center, for a connector 1 only about 200 mils high).

In this fashion, mating companion header pins will enter holes wherein the fragile associated PCB pins are already seated and will be similarly wiped alongside these and will cam-open the near portion of their associated resilient rings. Each pin should be somewhat pointed or chamfered at its free end to so cam its way into these bores as well as to cam-open its ring segment.

The foregoing "two-step" pin-insertion mode will be understood as afforded as a feature hereof, particularly to accommodate initial insertion of fragile pins (e.g. P-1, P-1' under little or not insertion-force $F_i$, with the ruggeder pins (e.g. PP, PP') inserted later, and acting to force-open the resilient engagement means, effect pin-wiping, etc.

As a preferred feature hereof, it will be noted that adjacent rings (e.g. R, R') are vertically offset from one another—this allows holes h, h', and associated pins therein, to be placed closer together and so accommodate higher-density pin arrays, as workers in the art will appreciate Workers will see that the tiny size and particular placement of such rings R, R' and their associated "lateral engagement" of pins facilitates such an "offset'-'—indeed in some instances a third, fourth, etc. offset may be employed. It also affords a "two-step" insertion mode for a header (D), whereby, for any two adjacent "second-in" pins PP, PP', the set of first pins (e.g. PP) will apply their insertion force to spread their rings (R, etc.) and then (second step), the second pins (PP') will similarly spread their rings (R', etc.). Workers will appreciate how convenient it is to reduce the insertion force at any given moment by such a multi-step process. And, when combined with the prior insertion of the PCB pins, a three-step insertion mode results here.

As workers will see, such "staggered insertion" could be made a "three-step", or "four-step", etc. configuration (assuming increase in height and fabrication expense).

Figure 3:
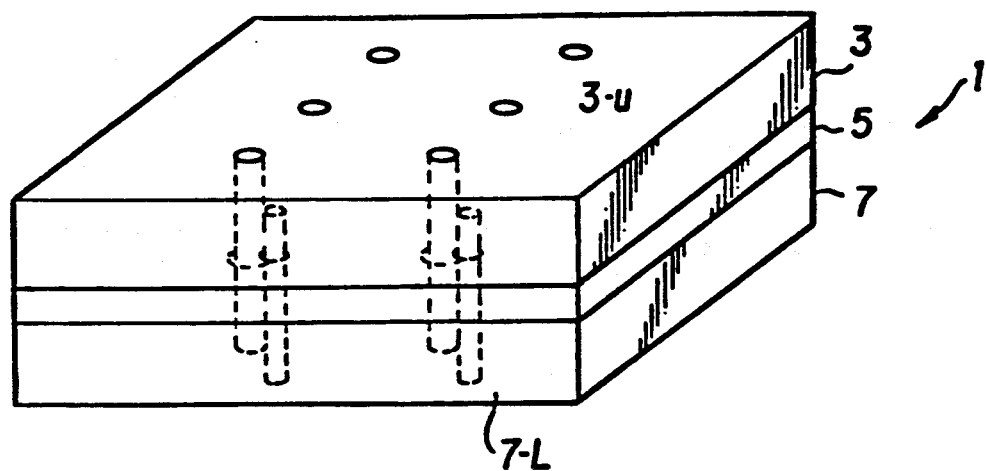
Figure 3A:
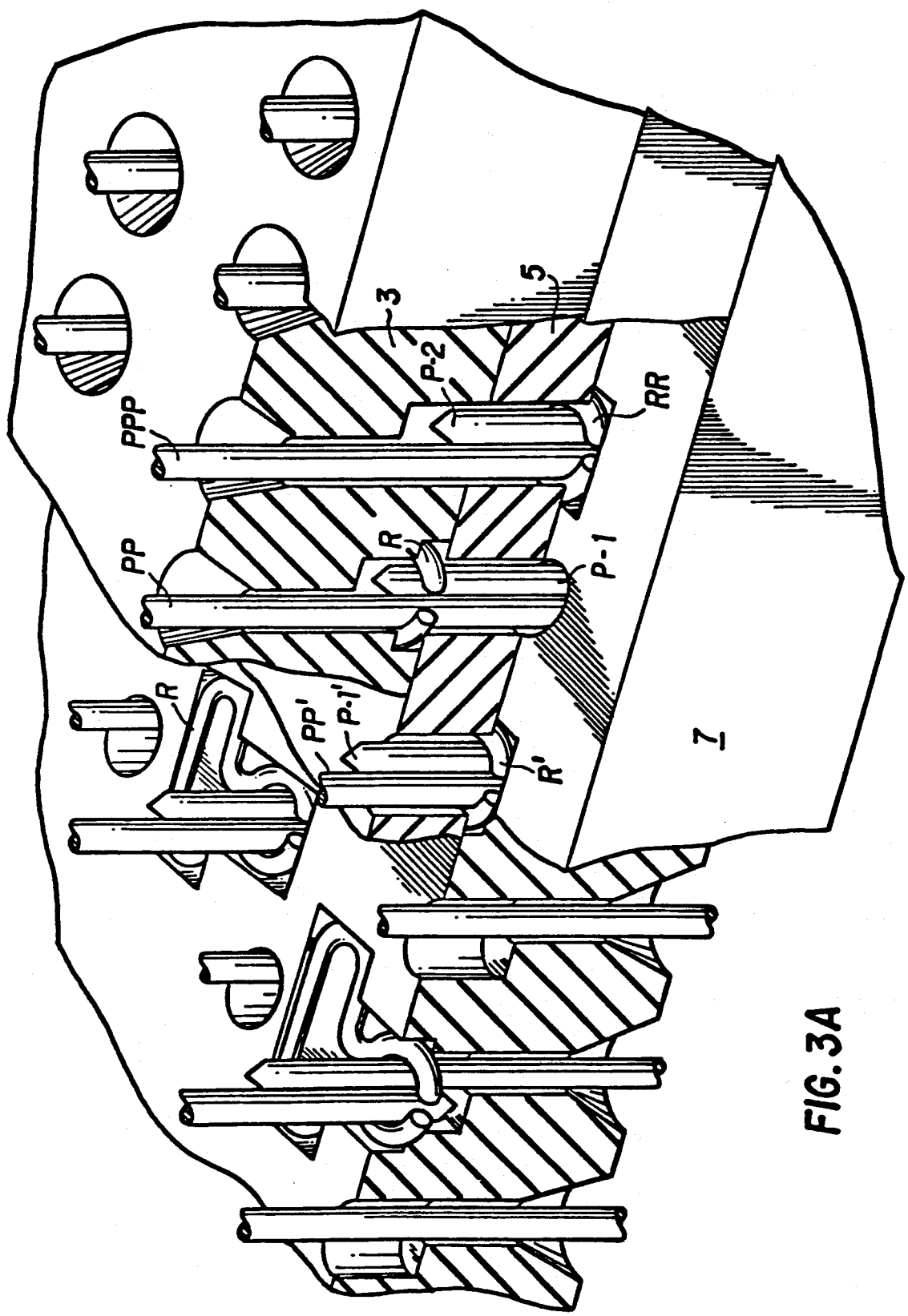
Figure 4:
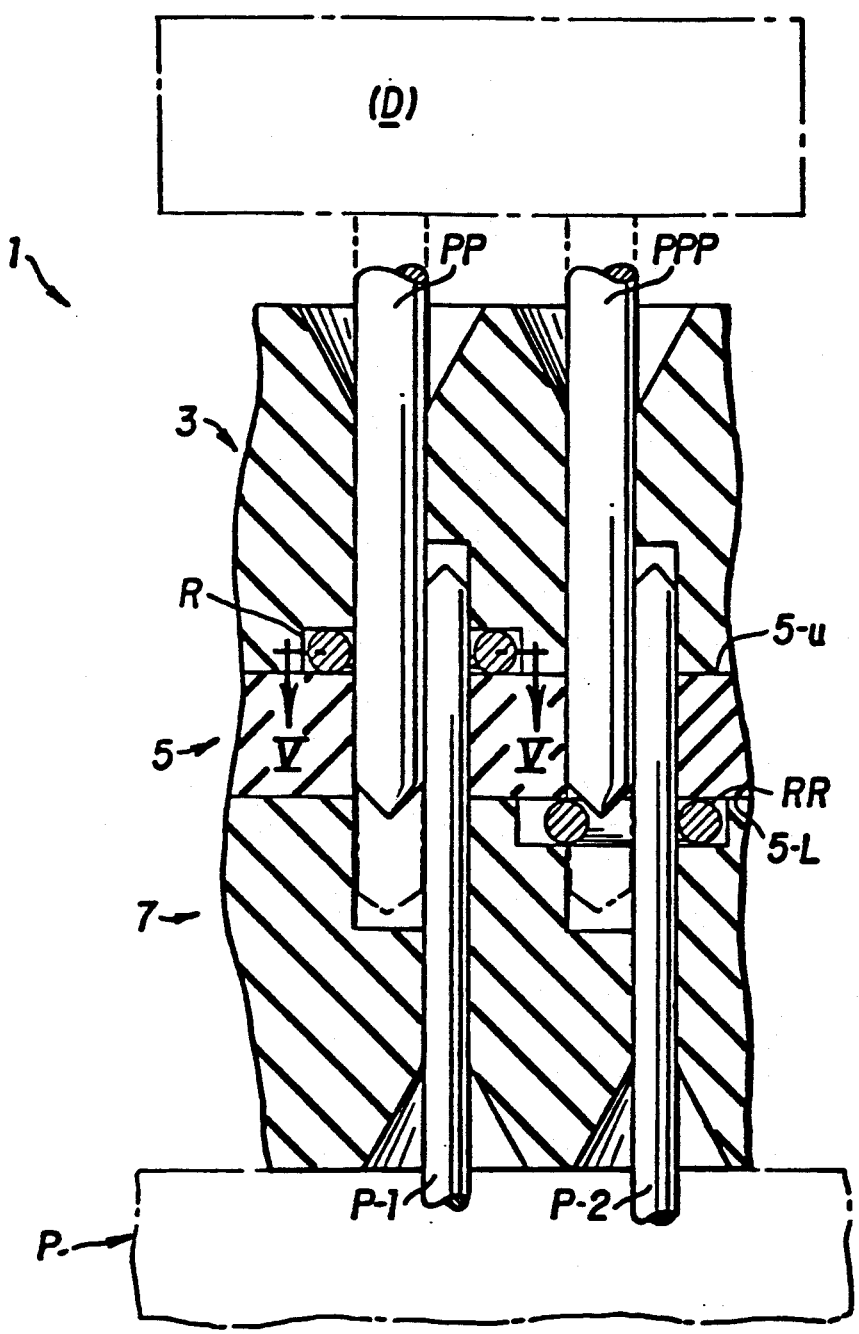

FIG. 3 shows connector 1 in very schematic perspective, while FIG. 2B shows it exploded-apart, with an exemplary floating ring R' disposed in one part. FIG. 3A shows in schematic fragmentary view a portion of connector 1 with exemplary mating pins inserted and/-pin-engaging rings (R, R', RR, etc.) depicted. FIG. 4 is similar to FIG. 3A, but in partial section and schematically depicts the full-insertion of fragile PCB pins (e g. P-1, P-2) with partial-insertion of the ruggeder header pins (cf. pin PP effectively engaged with its mating pin P-1 and associated floating ring R; but companion header pin PPP not quite so engaged with its ring RR and mating pin P-2; i.e. needing to be further inserted for this).

Figure 5:
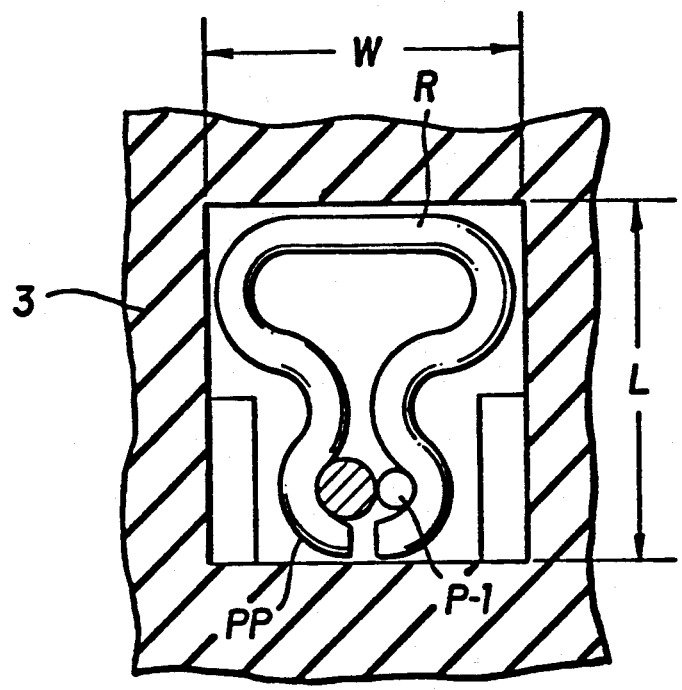
FIG. 5 shows a plan view of a preferred "floating ring" engagement means for such, connector embodiments, this ring shown enlarged in FIG. 5A and in schematic perspective in FIG. 6.

FIG. 5 shows, in cross-section, a preferred version of one such floating ring R engagement means—with pins P-1, PP seated spreadingly within the resilient, pin-receiving portion thereof (ring discussed further below, e.g. in connection with FIG. 5A). As FIGS. 2B and 3A more clearly depict, exemplary ring R in FIG. 5 will be understood as disposed in an associated cavity of upper connector-plate 3 (see FIG. 4 and section A--A; note: half of the rings so disposed in 3, while the other half, being vertically offset, are similarly disposed in lower connector plate .7, e.g. as for ring RR in FIG. 4). As schematically depicted in FIG. 5, the rings (all identical, in identically-configured cavities cut into the top of either plate 3 or plate 7, as known in the art) "float" in their cavity, with some prescribed lateral tolerance so a pin (e.g. P-1) can move it slightly upon entry, etc. (e.g. see spacing in direction of width w). Tolerance and "slip" in the orthogonal "length" direction (see L) is less critical, though a bit is preferred.

Otherwise, the pin-engaging resilient arms of each ring should rather closely surround its associated (two-pin) hole.

Figure 5A:
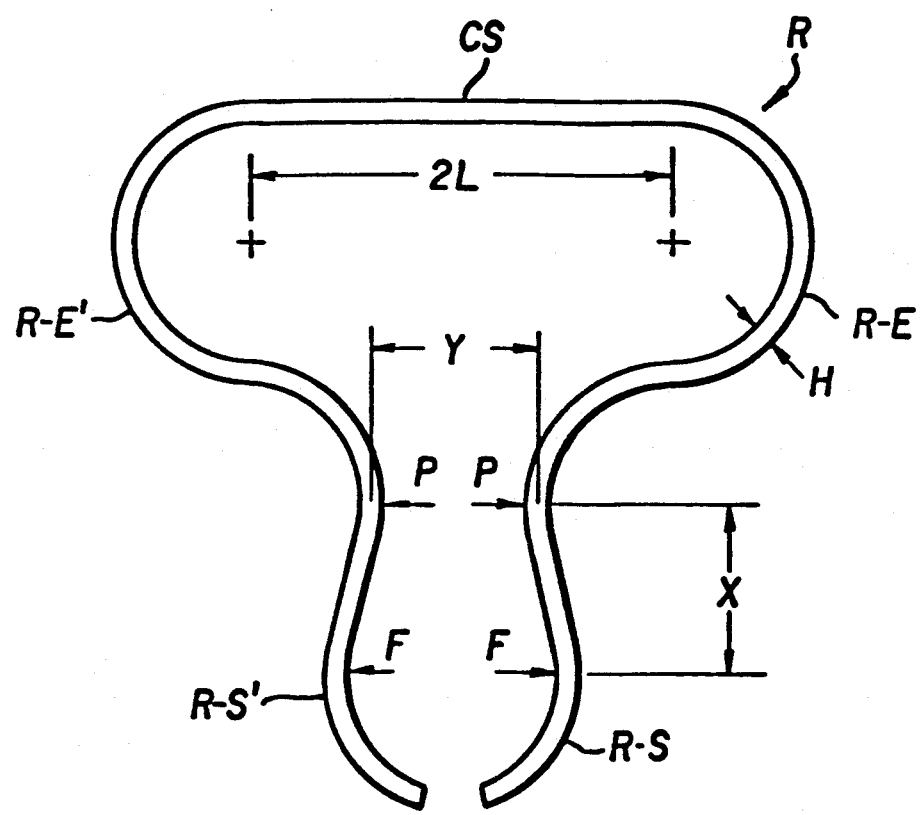
Figure 6:
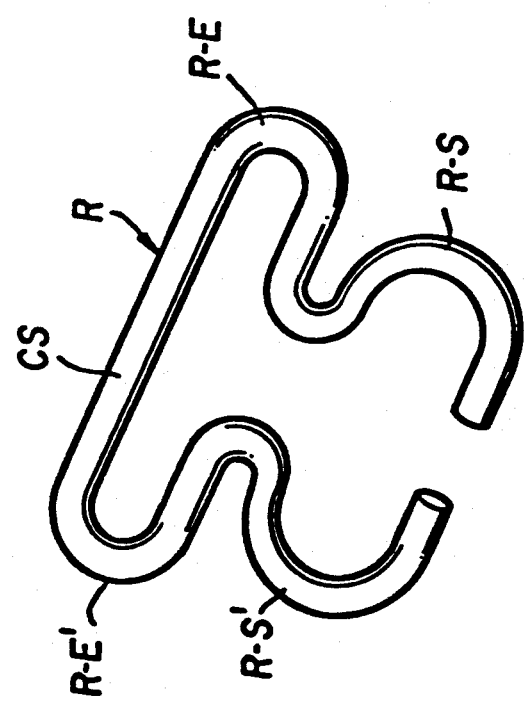

FIGS. 5A and 6 show a somewhat enlarged perspective of such a ring R in static, "un-spread" condition. As further described below, workers will recognize that such an engagement ring R comprises a pair of opposed curved pin-contact segments R-S, R-S' projected from resilient extender sections R-E, R-E' respectively, the latter being connected by a connector segment CS. Sections R-E, R-E' are adapted to present a relatively long "beam-length" (along direction L) from which the resilient sectors R-S, R-S' are projected, making the ring less sensitive to variations in pin sizes and positioning tolerances.

Preferably, the inner portion of the ring segments R-S, R-S' are curved somewhat to conform (to at least some degree) somewhat to the curvature of the pins to be received (even if the pins are of two different thicknesses and radial sizes; as here). One pin must be thick enough to withstand insertion forces without buckling (cf. gate array can allow 20 mil diameter pins, on 50 mil centerlines—vs a high-density PCB where 50 mil grid allows only 10 mil pins).

FIG. 5A is a plan view of a contact ring embodiment R along the lines of the aforedescribed rings (see especially FIG. 6) wherein the various dimensions are given as follows in exemplary fashion (TABLE A).

TABLE A

| | |
|---|---|
| Normal Force F: | 154 grams |
| Maximum Stress (aT A): | 121,000 PSI |
| Moment of Inertia, I: | $5.47 \times 10^{-10}$ |
| Spreading distance y: | 0.0053 inch |
| Modulus of elasticity, E: | $19 \times 10^6$ |

The foregoing will be even better understood after consideration of FIG. 3 showing connector 1 made up of upper and lower plates 3, 7 with medial segment 5. Here one may assume that a portion of a printed circuit board P will present its pins to be inserted on one side e.g. from lower side 7-L of plate 7; with the exposed side of plate 5 adapted to receive device D with its pins similarly inserted into prescribed mating holes as described above. The pins and respective engagement rings are shown very crudely, generally, and in phantom.

FIG. 3A shows a portion of the connector arrangement 1 in partial section where, for instance, ring R is shown engaging PC pin P-1 wipingly against header pin PP, and similarly ring R' shown engaging PC pin P-1' wipingly against header pin PP', and so forth.

FIG. 4 is a schematic idealized sectional elevation of ring R in FIG. 3A, etc. with its associated mating pins, along with adjacent ring RR and its associated mating pins—except that header pins PP, PPP are, here, only partly inserted (PP has already spread its ring R, while PPP is about to spread its ring RR).

The PC board P and the header packages DD' to be connected thereto are both fitted with male pins of lengths, spacing and diameter determined by the application (e.g., 1700 pins with multi-chip module pins on grid of 0.05–0.07"). The connector 1 itself consists preferably of three molded pieces as indicated (e.g. FIG. 4): i e. upper and lower plates 3,7 welded, or otherwise bonded to intermediate plate 5. Cavities for the "upper" rings R, etc. are provided on the lower surface of plate 3, those for the "lower" rings (RR, etc.) cut into the upper surface of lower plate 7. Each ring surrounds the juncture of a pair of adjacent bores (one for each pin).

The upper and lower surfaces of intermediate plate 5, namely surfaces 5-U and 5-L respectively, may be coated with conductive material to provide a power or ground plane. Workers will appreciate how convenient this connector unit 1 is for such fabrication.

That is, in certain instances it will be apparent that median connector plate 5 may be provided with an upper and lower metalized surface 5-U, 5-L, see FIGS. 2 and 4, which may conveniently be thrust into ohmic connection with contact rings R, RR, etc. (cf. FIG. 4) to thus connect the engaged respective paired pins with a power potential or ground, etc.

Advantages

Figure 1:
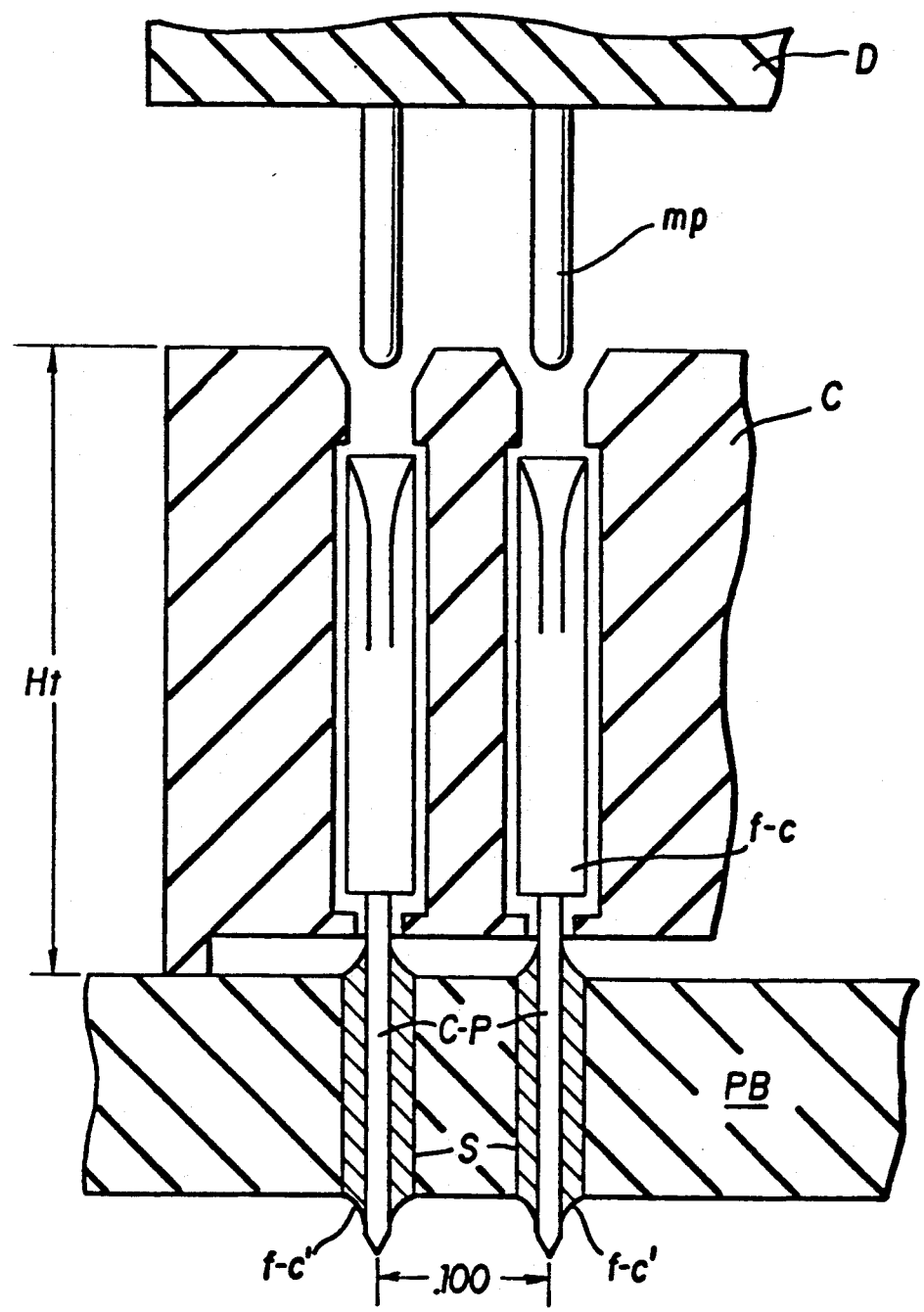
FIG. 1 is a very schematic sectional fragmentary elevation of a Prior Art Connector C.

The advantages and results achieved with such an embodiment (FIGS. 2-6) will be quite apparent to those skilled in the art. It will be apparent that this provides a unique floating spring clip or ring R for each pair of mating header/PCB pins, thrusting header pins into ohmic engagement with respective PCB pins, and holding them so—doing so in a "two-faced-female" (or "female-female") connector unit 1—as opposed to the common mode of inserting header pins into female contacts of a connector having tails which are, in turn, soldered to the printed circuit board (e.g. as in FIG. 1).

This connector 1 can be designed as a "low insertion-force" (LIF) connector as shown (two-step insertion, offset rings) or in certain cases a "zero insertion-force" (ZIF) connector. In some cases one may use means such as a "shape memory alloy" for the rings (R, R', etc.)- (such an alloy is supplied by the Rachem Corp. of Menlo Park, California under the tradename "Tinel"). Such a "shape memory" alloy may be constructed so that the rings will automatically pop open when subjected to a given temperature To (self-opening, e g., when cooled below zero° C. by spraying-on freon, refrigerated air or the like, so that both sets of pins may be inserted with zero force; and then the temperature raised, (e.g. to ambient temperature Tc) whereupon the rings responsively close (for instance, heat to about 70° F. so the rings will compress together, each gripping their two intermediate pins tightly). These rings may also be so popped-open with cooling means for pin withdrawal, as workers in the art will appreciate.

It will thus be apparent how such a "two-faced-female" type connector 1 may provide better ohmic connection between one or more high density pin grid arrays (headers) and virtually any given printed circuit board (provided with appropriate projecting pins therefor)—for instance, it may be used on a multi-chip module for up to 25 chips (4" ceramic square) for a PCB with the order of 1700 pins. Existing PCBs can be retrofitted readily to adapt to such a connector 1.

We have seen that, with this invention, small fragile pins may, for instance, characterize the PCB pins (P-1, etc. projecting from board P); these to be inserted first into respective holes in such a connector under essentially zero insertion force (ZIF), thus accommodating their fragile nature. And, thicker stouter header-pins (PP, etc.) may thereafter be inserted under some insertion force (to spread their respective rings) in a later step or steps.

Workers contemplating such embodiments will appreciate how a ring R may simply "float" in its cavity in connector 1 without necessarily imparting any significant thrusts against the outward walls of this cavity and thus without inducing housing "creep", etc. Note how this "floating" arrangement allows some latitude for the positioning of the pairs of pins and how it can take up dimensional tolerances in the board P, in the headers D and in the connector 1, as well as in their respective pins (including anomalies in the "angle of attack" of the respective pins).

It will be apparent that the entry portion of the two-pin-receiving holes h, h' is chamfered to re-direct a slightly skewed entering pin, steering it along the respective inner portion of the hole, or partial-bore, as known in the art.

Other advantages to this "floating" ring will be evident; e.g. as aforementioned, it allows insertion of the "first" pins with zero force, the second-in pins serving, alone, to "spread" the rings.

Regarding the "floating" of these connector rings, one may compare this with the rigid soldered type of ohmic joints (connections) that are now common. A connector like 1 maintains a more efficient, more consistent ohmic contact force, particularly where an increased beam length is exhibited by the resilient rings. And, unlike a conventional MALE-FEMALE connector, misalignment of the mating pin pairs will not increase contact forces. Also, a floating connector ring allows "three-point", controlled force contact in all cases. A fixed female connector, by contrast, may "lose" contact points due to misalignment. Also, such a "floating" ring contact can give the desired mutual pin wiping and "three point ohmic contact", with high orthogonal contact-forces, despite variation in pin sizes, variations in the insertion angle of the pins and despite relatively low insertion force than with commonly available connectors with equivalent orthogonal force. A soldered joint connection can crack or break, interrupting electrical continuity, whereas our spring connection is much more stable for maintaining ohmic contact under high shock and vibration, etc.

Note that the position and size of the pin-receiving bores h, h' need not be critical, or such as to force this mutual wiping action of one pin versus another, since the engaging action of the surrounding floating resilient ring R will force this, this relieves workers from so precisely positioning and dimensioning the holes for such purposes and avoid placing stress upon the plastic housing and the pins themselves. Indeed, without such a "floating ring" connector, it appears impossible to secure pin-wipe action for such tiny, fragile, closely-clustered pins as described. Workers will note important advantages to this.

Mutual-wiping; three-point contact

Consideration of the embodiment, (e.g., in FIGS. 3A, 4) will make it apparent that a very special "mutual-wiping" action will be forced by this arrangement, whereby opposing paired pins are forced to scrape wipingly along one another's length in the normal case, both upon entry and upon withdrawal; also at least one pin will scrape along the side of the associated contact-ring (R, etc.).

As workers know, such wiping can be very valuable for removing dirt, corrosion, oxide and the like from pin surfaces, as well as from the contact surfaces of a ring. An associated advantage will be noted as a "three point contact", electrically, (that is pin-pin, pin #1-ring, pin #2-ring), whereby, even in the case of corrosion along one of the contact-ring segments, continuity from pin to pin, or pin-ring-pin may still be established. Workers will consider this a very valuable advantage, one not found in connectors commonly available.

Figure 7:
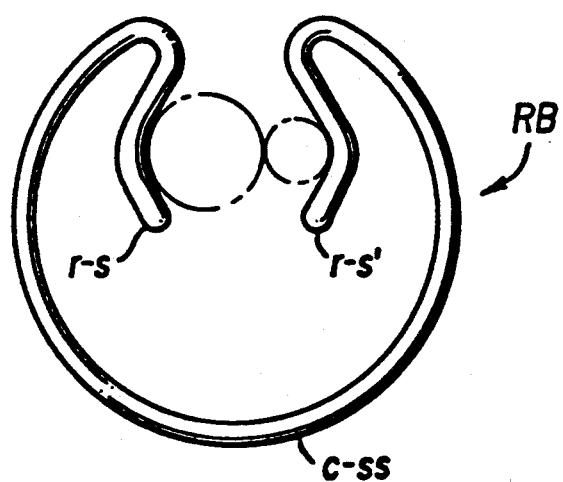

FIG. 7 shows an alternate kind of ring contact RB to that discussed above (e.g. re FIGS. 5,6), and made and operating similarly except as noted. Here a pair of contact segments, r-s, r-s' will be seen as resiliently biased against two intervening pins (in phantom), being projected in spring fashion, theretoward on the end of a semi-circular join-segment C-ss. In cases where an extended lever arm is wanted, this embodiment will be less favored.

Figure 8:
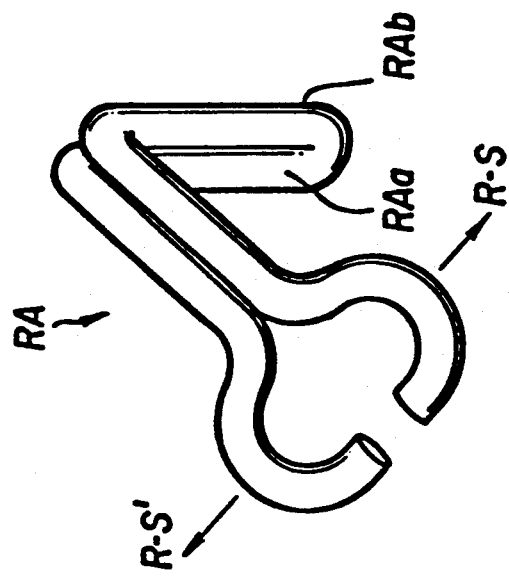
FIG. 8 shows an equally preferred, or more preferred variant thereof.

FIG. 8 shows another alternate kind of ring contact RA, made and operating like ring R in FIGS. 5, 6 except as noted. Here, R-E/R-E' and CS of ring R (FIG.6) are reconfigured into a pair of relatively parallel segments extending away from contact segments R-S, R-S', in the plane thereof (along $RA_a$) and also bent (e.g. orthogonally) along an extension of these segments (see bent segment $RA_b$) to achieve a longer, extended torsion arm.

Figure 10:
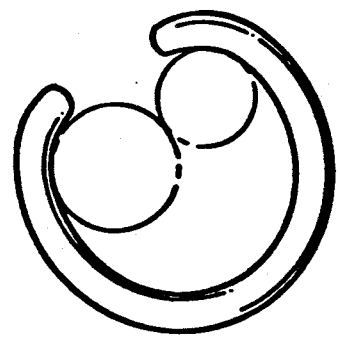
FIGS. 9 and 10 are alternate forms of the ring in FIG. 5.
Figure 9:
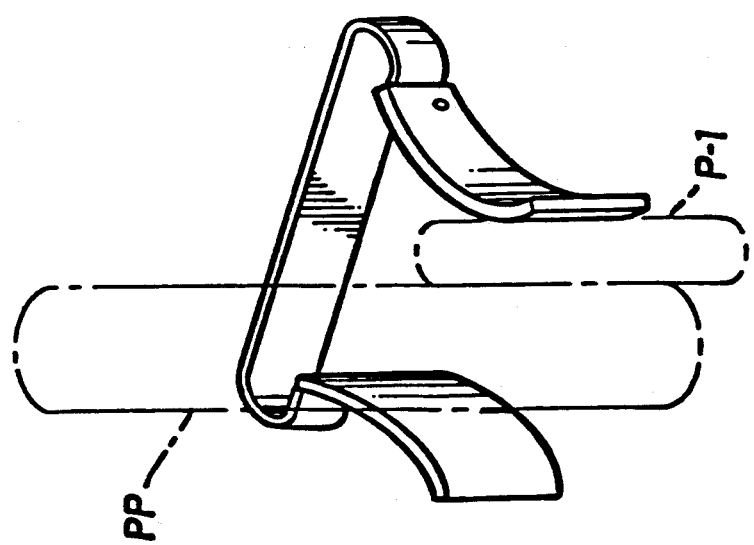

FIGS. 9 and 10 show still other alternative types of engagement rings, with engaged pins therein indicated in phantom.

Second Connector Embodiment (FIGS. 11-23)

Figure 12:
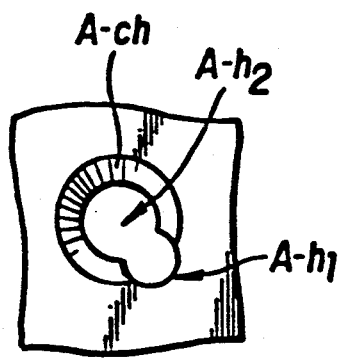
Figure 13:
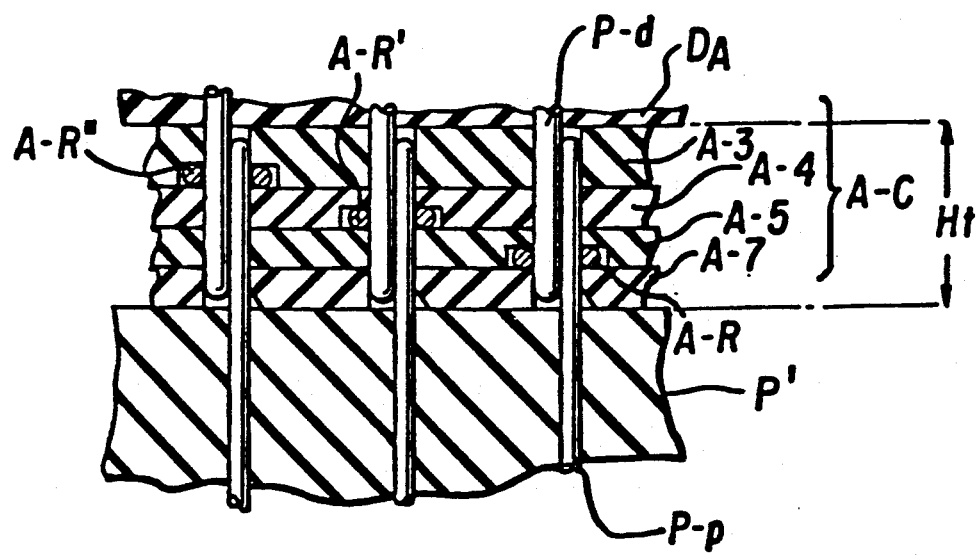

FIGS. 11-23 indicate a second connector embodiment A-C preferably comprised of four superposed connector plates A-3, A-4, A-5 and A-7 as indicated for instance in FIG. 13, sectionally; here with three (rather than two) sets of connector rings (e.g. see FIG. 13 rings A-R, A-R', A-R").

Figure 11:
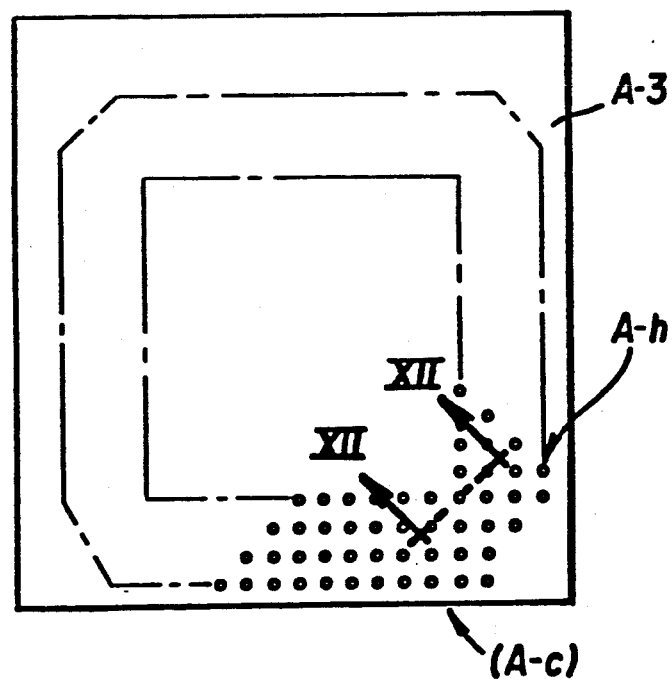

The upper plate A-3 is indicated in plan view and schematically in FIG. 11, with FIG. 12 indicating (in enlarged detail) how adjacent pin holes A-h1 and A-h2 are juxtaposed, with an outer chamfered section A-ch preferably surrounding at least a portion thereof for pin guidance as known in the art.

FIG. 13 is somewhat analogous to FIG. 4 and will be understood as indicating connector A-C as adapted to allow pins P-p projecting from printed circuit board P' to be wipingly engaged with larger pins P-d oppositely projected from gate array (or like) device Da.

Figure 17:
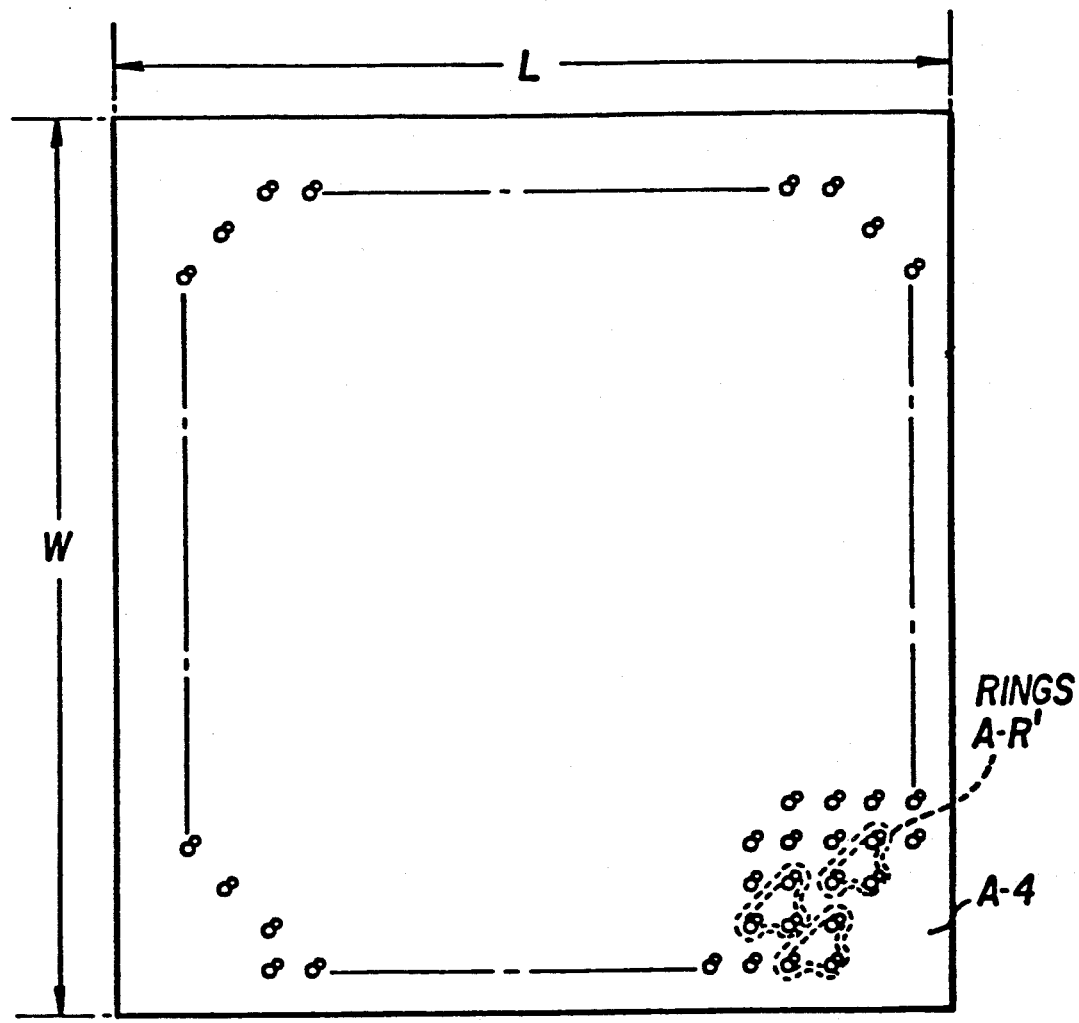
Figure 18:
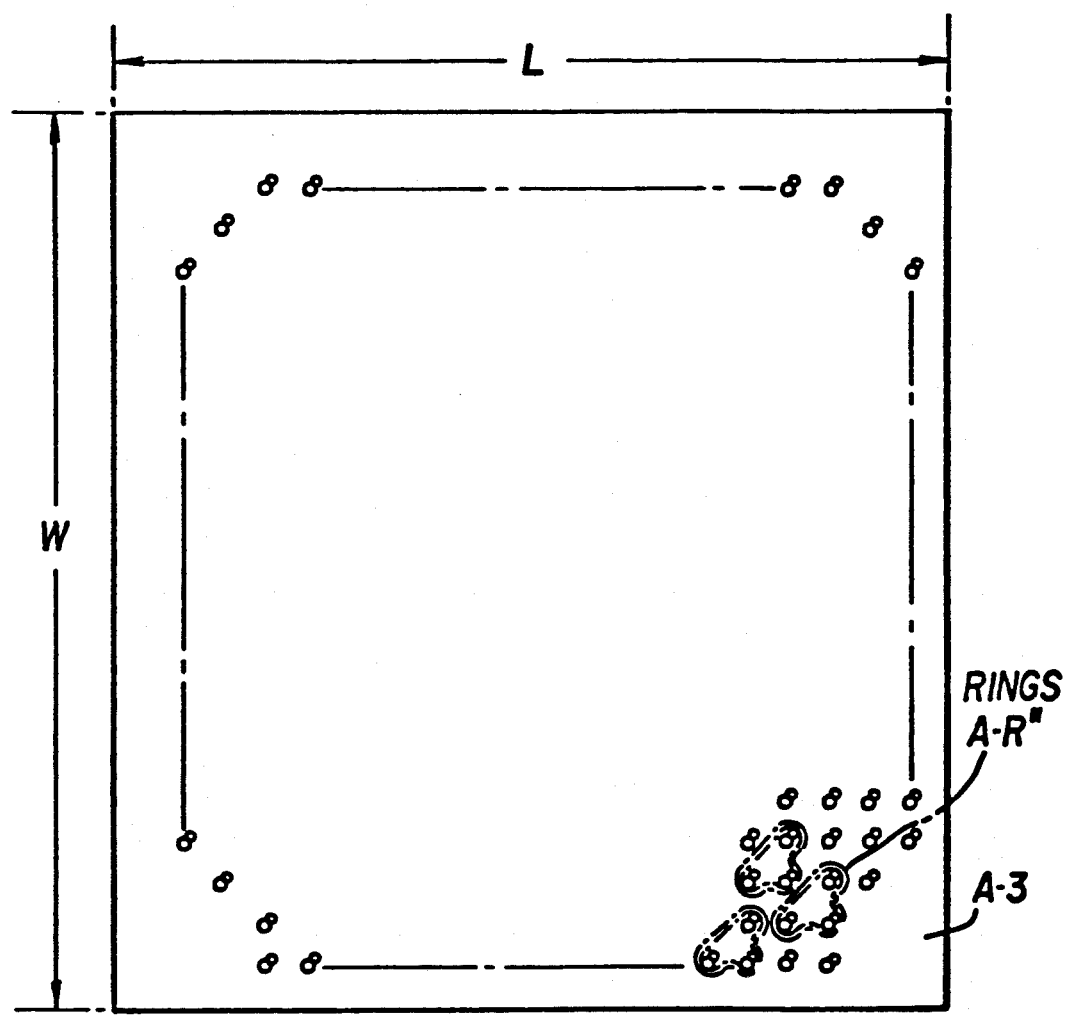

Upper plate A-3 may be seen in top plan view in FIG. 18 with rings A-R" on the opposite face thereof shown in phantom; similarly FIG. 17 is a top plan view of sheet A-4 with associated rings AR' on the opposite face thereof likewise shown in phantom.

Figure 14:
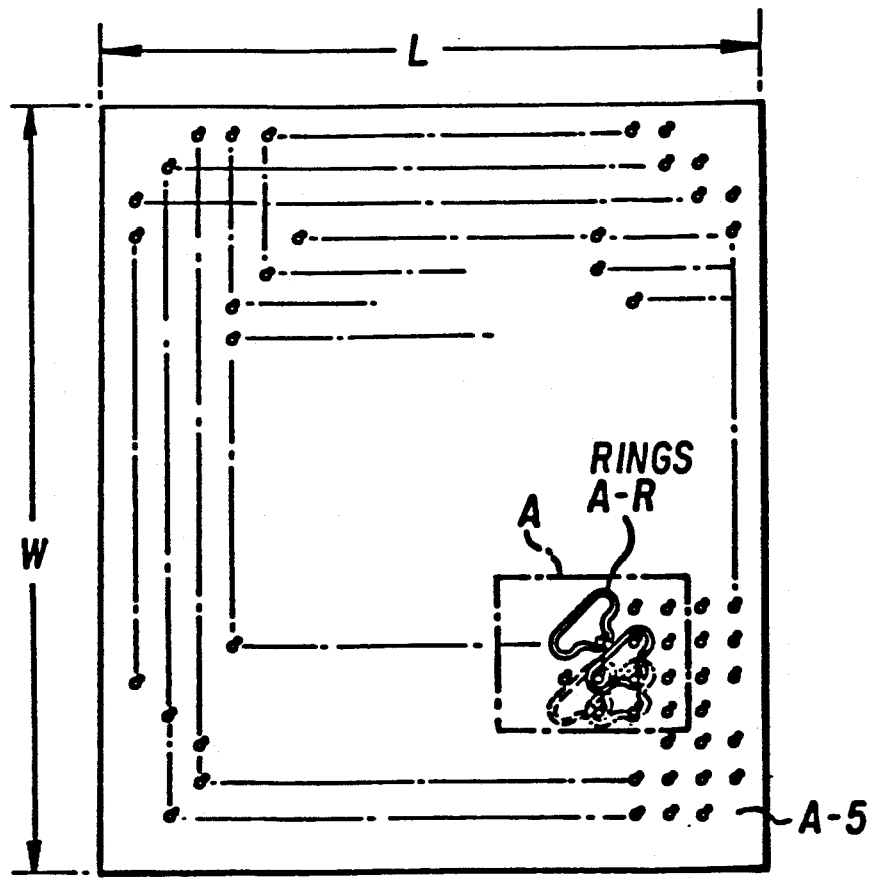
Figure 15:
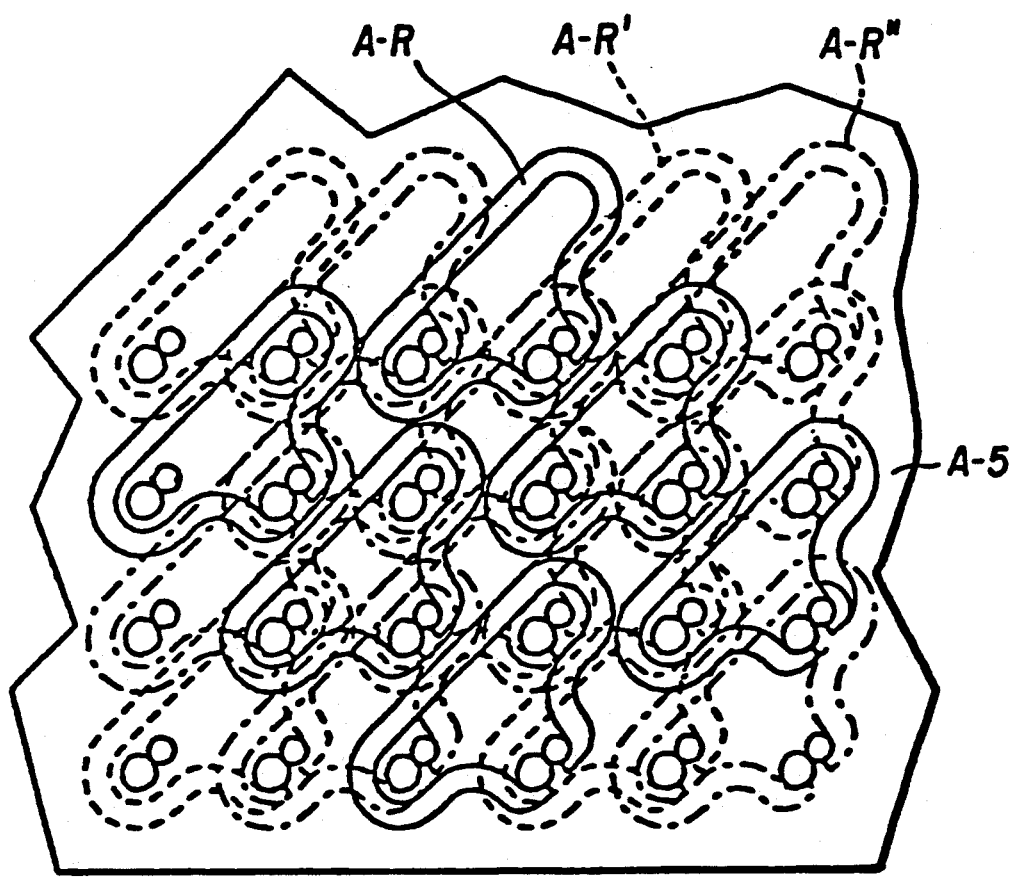

Plate A-5 is shown in bottom plan view in FIG. 14 with rings A-R thereof shown in full line. FIG. 15 shows a very schematic enlargement of a portion of FIG. 14 showing rings AR in "full-line" with rings AR' shown in "dashed-line" fashion and rings A-R' shown in "dash-dot-dash" fashion.

Figure 16:
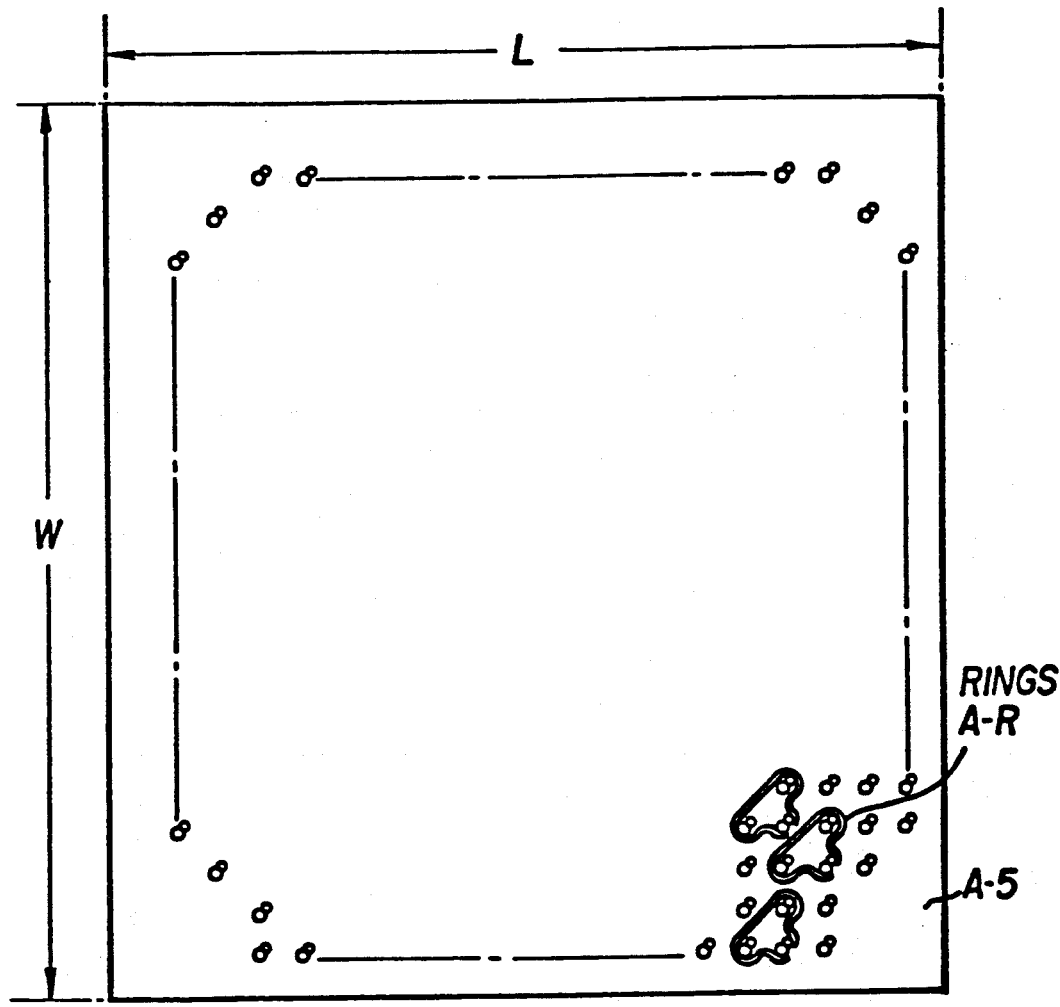

FIG. 16 similarly shows the same as FIG. 14 with the phantom view of underlaying rings deleted. (note here there are no cutouts or holes to position these rings in place as opposed to the prior embodiment). However, preferably spacer-bosses bs are provided (slightly thicker than rings AR-1, etc.) to space-apart a juxtaposed sheet without constricting these rings (see FIG. 19 where a few bosses bs are shown examplarily).

Figure 19:
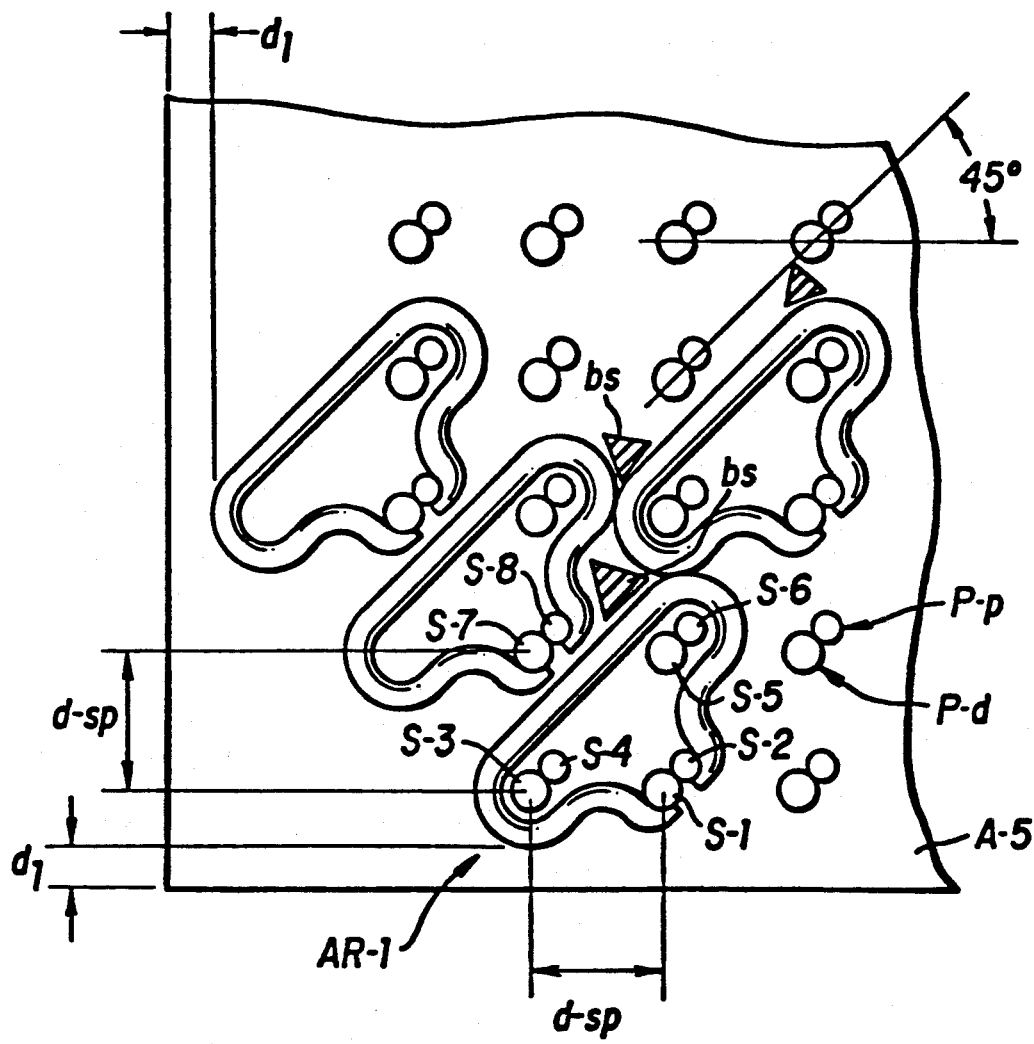
Figure 23:
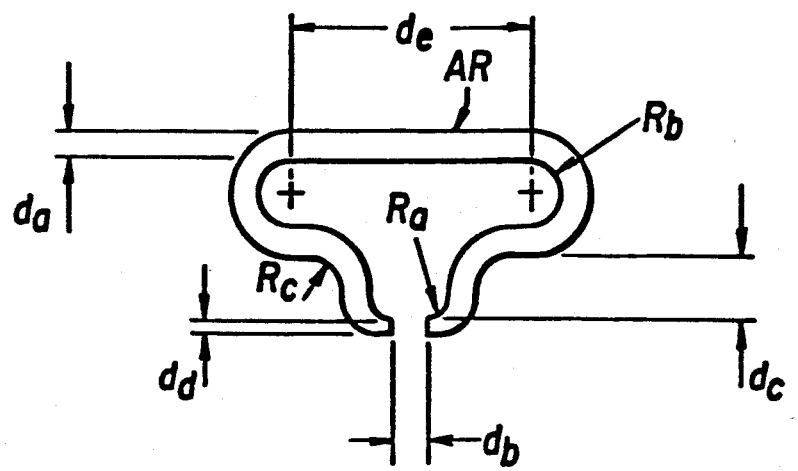
FIGS. 20 and 23 in schematic plan view, with exemplary characteristics thereof tabulated in FIG. 22, and exemplary values of force and stress tabulated in FIG. 21.
Figure 20:
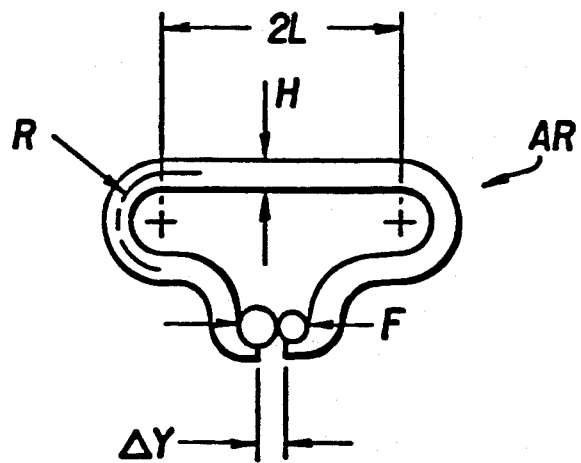

FIG. 19 is a further enlarged partial schematic view of a portion of FIG. 16 with a few connector rings AR shown in some detail and in conjunction with nearby pin pairs. Here it will be assumed that the smaller pins from (PCB), P' namely pins S-2, S-4, S-6, etc. are all separated by common distances d-sp as are the pins S-1, S-3, S-5 from device D as known in the art. Engagement rings AR will be observed as similar to those aforedescribed (e.g. in FIG. 5) except for being opened up and lengthened along their lateral axis (see segment CS in FIG. 5) so as to loop about and skirt two adjacent pin pairs—e.g. note that ring AR-1 joining pins S-1, S-2, is extended laterally to loop about pin pairs S-3/S-4 and S-5/S-6. Workers will observe how this opening-up of the rings allows one to nest the rings closer together, providing space for a relatively large strong ring while still accommodating closer spacing of pin pairs. This type of ring AR is shown in somewhat more schematic detail in FIGS. 20, 23, with FIG. 22 presenting characteristics thereof in tabular fashion [e.g. material BeCu "Cl 72" as specified as ¼ (hardness), heat treated (HT) to exhibit a yield point (YP) of about 150K PSI minimum]. Thickness H and length L dimensions as well as curvature radius R are indicated in FIG. 20 along with the value of spreading distance or deflection Y [together with the equation therefor) and the modulus of elasticity E. Also given are the equations for moment of inertia I and for maximum stress S. The indicated deflection Y of about 7 mils will indicate the "loose fit" of the ring and its ease of manufacture to workers in the art. As workers will realize, the ring may be virtually any convenient cross-section such as round, elliptical, or rectangular.

FIG. 21 correlates normal force (see FIG. 20) and maximum stress S for "nominal" and "worst" cases (min/max) as understood in the art. The maximum stress will be understood in the art. The maximum stress will be understood as never exceeding about 75% of the yield point YP.

Workers will understand that the normal force F urging the pins together is quite important and would normally be kept relatively high (e.g. keeping the pins from accidently springing open out of electrical connection, introducing corrosion, spaces, etc.). Workers also understand that, for simple inexpensive production, it is hard to keep close tolerances of such dimensions while still operating within an acceptable yield point. For instance spreading tolerance of plus or minus 2 mils (as indicated in FIG. 22) is a reasonably easy tolerance to keep, yet if this tolerance were tightened to plus or minus 1 mil (with B plus or minus ½), then the spread of retaining forces F would narrow to the order of 70-150 grams and be much more predictable and controllable. Thus, workers must balance yield tolerances vs force-variance Workers will, of course, be guided to set narrower deflection tolerances to achieve closer control of retaining force.

ADVANTAGES (Reprise)

Workers will find many advantages inherent in the foregoing and like embodiments, such as the following:

1. Lower profile a much thinner profile (height) of connector 1 is made possible—note the female-female character of connector 1, despite the offset nature of adjacent connector rings, allowing a connector having height as little as 0.2 inches as noted above.

2. Reduced path length: this low profile and the associated reduced length of the conductor-paths will be highly valued by workers, especially where high-speed micro-circuit arrangements are involved.

3. Better contact efficiency: the mutual wiping action of the pins, and their associated connector rings, was discussed above.

3A. Mutual pin-wipe.
  3B. Three-point contact.
  3C. High orthogonal contact-force: between pins and ring, at contact points; e.g. to spread the ring.

4. Higher pin density: the susceptibility of this connector for higher pin densities, (e.g. on the order of 0.05 by 0.05 inches spacing) has been noted above (cf offset pin-pairs). It is possible to use a connector 1 for connection to a "super wafer" having 36 by 36 pins on 70 mils center lines, something for which no existing interconnect is presently available on the market (each header being 4 inches by 4 inches.

5. Ready separability, e.g., for field-fix or rework—workers will appreciate that it is not necessary to solder connections or otherwise make a permanent (or semi-permanent) connection between headers D and boards P, as is too often true with conventional connectors.

6. Zero insertion force; Low insertion force: the possibility for zero insertion force for at least one set of pins (e.g., those on board P) has been illustrated and the possibility of low insertion force for other pins (such as those of the headers) has also been discussed, particularly in the case of the "two-step" pin insertion described above.

7. "Floating" connector-engagement means: resilient holding means R for paired-pins can be made to "float".

8. Connector is "hidden", protected:

Unlike conventional connector engagement mechanisms, the preferred "floating rings" are hidden within a housing with no protruding or fragile parts to be damaged. 9. Rugged connector rings: our connector rings are more rugged than conventional mechanisms and much less likely to be damaged by pins.

Connector rings: the shape of the contact rings R is not necessarily optimized.

One can gold-plate the ring in FIGS. 5-6 for corrosion resistance and good ohmic conduction. Also, as one modification of the FIGS. 2-7 embodiment, a plurality of contact rings can be provided for engaging each pair of wiping pins. For instance, two rings can be used in place of each single ring shown, one being seated in upper plate 3, the other in lower plate 7 and surrounding all holes (rather than "offset" as in FIG. 4).

Preferred fabrication of connector: in further description of FIG. 4, note the following: the connector unit 1, itself, consists preferably of three molded pieces 3, 5, 7, as mentioned above. The top and bottom plates 3, 7 contain countersunk lead-in holes with a tightly-toleranced two-pin guide-shaft h leading to the ring cavity C-R in each case. This allows rings R to be secreted inside the overall unit 1, while making it easy to form cavities C-R for receiving them.

For further convenience, each upper and lower part 3, 7 may itself be formed from two parts, one of which circumscribes the ring cavity, thus allowing one to stampout the cavity rather than routing it out as known in the art.

The center molded section 5 is a simple flat piece with the paired-pin holes (slightly larger than the sum of the mating pin diameters) cut therethrough. Center piece 5 facilitates assembly of the connector by allowing for, and maintaining, the placement of the floating rings as mentioned.

The offset disposition of adjacent rings (R, etc.) accommodates a higher density of pin connection (closer together) as well as a low force, two-step insertion mode. The reaction forces are all within the ring R, thus eliminating housing creep as mentioned. Once these holes and cavities are formed and the contact rings in place, the three parts of connector 1 may be readily bonded (e.g., by ultrasonic welding) to form one unitary connector unit 1.

A "two-faced female" type connector unit is much less sensitive to tolerance variations than those commonly available.

Not only is such a connector relatively easy and reliable to fabricate (e.g., in a three part assembly, as mentioned above), but the resilient connector rings are hidden within the body thereof and much better protected from mechanical damage by external means.

It will be understood that the preferred embodiments described herein are only exemplary, and that the invention is capable of many modifications and variations in construction, arrangement and use without departing from the spirit of the invention.

Further modifications of the invention are also possible. For example, the means and methods disclosed herein are also applicable to connecting other like devices to PCB pins and the like, as well as to analogous pin devices. Also, the present invention is applicable for providing connectors, and/or associated contact-rings in other contexts, such as those in which other paired conductor-posts are to be engaged.

The above examples of possible variations of the present invention are merely illustrative. Accordingly, the present invention is to be considered as including all possible modifications and variations coming within the scope of the invention as defined by the appended claims.

What is claimed is:

1. Two-faced female connector means adapted for ohmic connection of a number N−1 of first pins P-1, each with a respective one of a set of second pins P-2 projected oppositely from one or more connectable devices D-1, D-2, etc., this connector means being characterized by a number N−1 of paired bores, each arranged and adapted for receiving a respective pair of oppositely-projected first and second pins P-1/P-2 in wiping engagement; and a number N-2 of conductive gripper means, each said gripper means being adapted for so engaging a respective pair of said pins, and adjacent gripper means being offset from one another in the thickness direction of the overall connector means;

said connector means comprising a plurality of relatively planar plate means, with at least one of said plate means adapted to receive and retain a first set R-1 of gripper means, plus at least one other of said plate means disposed adjacent said first plate means, each other plate means being adapted to receive and retain a respective further set R-2, etc. of gripper means.

2. The invention of claim 1, wherein each said gripper-receiving plate means includes a number of cavity means, each cavity means being adapted to receive and position a respective gripper means about its respective pair of so-engaged pins.

3. A method of making a connector for ohmic connection of a first set of pins projected from a first device with respective ones of a second set of pins projected oppositely from one or more other devices adapted for connection with said first device, this method being characterized by:

selecting at least one non-conductive connector matrix means; forming a number of two-pin-receiving bores through each said matrix means, each said bore being formed and disposed to receive a respective pair of said pins juxtaposed; and providing conductive gripper means about each said pair of pins such as to receive and urge the pins into side-by-side, wiping engagement and good ohmic connection; each said gripper means being formed to comprise one or more resilient conductor segment(s) shaped and adapted to surround a given pair of pins, the segment(s) being adapted to thrust its pins toward one another; said pin pairs being set relatively closely together with at least a portion of the said gripper segment(s) being adapted to extend around one or more adjacent pin pairs without touching these;

each connector matrix means being formed and adapted to receive a relatively resilient conductive gripper means.

4. Female connector means adapted for connecting a first set of pins projected from a base device B, with respective ones of second pins projected oppositely from one or more connectable devices, this connector means characterized by paired bores for respective connecting pairs of said pins, each bore being cut to receive a respective pair of oppositely-projected pins in wiping engagement; plus an array of conductive gripper means, each gripper means adapted for so engaging a respective pair of said pins; and wherein the connector means further includes a plurality of relatively planar plates adapted to receive and retain said gripper means.

5. Female connector means adapted for ohmic connection of a number N−1 of first pins projected from a base means to a like number of second pins projected from a base means to a like number of second pins projected oppositely from one or more connectable devices, this connector means being characterized by N−1 paired bores for respective pairs of said oppositely-projected pins to be set in wiping engagement; and a number N−2 of conductive ring means, each said ring means being adapted for so engaging a respective set of pins; with adjacent ring means being offset from one another in the thickness direction of the overall connector means;

this connector means comprising a plurality of relatively planar non-conductive plates with at least one plate adapted to receive and retain a first set of gripper means, plus at least one other plate disposed subjacent said first plate, each other plate being adapted to receive and retain a respective further set of griper means, and so forth.

6. The connector means recited in claim 5, wherein said connector means is characterized by "pin-pair bores" there-through, each bore being sized and disposed for a respective pair of said pins, being cut to receive said respective pair of oppositely-projected pins in wiping engagement, each bore means also being formed and adapted to receive at least one ring means, each said ring means being adapted for so engaging the respective set of pins to be inserted in its bore means.

7. A connector array adapted for detachable ohmic connection of a set of first pins projected from a base device with respective ones of a set of second pins projected oppositely from one or more connectable devices, this connector array characterized by a non-conductive planar matrix with a spaced array of two-pin bores, one bore for each respective pair of pins, being cut to receive its respective pair of oppositely-projected pins:

plus a number of connector-ring means, one for urging each pin pair in wiping engagement; each connector ring means comprising a relatively resilient conductive wire segment, each connector segment adapted to surround its respective pair of pins together;

said bores and pin pairs being set relatively close together, with each connector ring means adapted to extend around one or more adjacent pin pairs without touching other pin pairs.

8. The invention of claim 7, wherein adjacent ring means are offset from one another in the thickness direction of the overall planar matrix.

9. The invention of claim 8, wherein the connector matrix comprises a plurality of relatively planar plates, with at least one plate adapted to receive and retain a first set of said ring means, R-1 plus at least one other plate a being adapted to receive and retain a respective further set of ring means, etc.

10. The invention of claim 9, wherein each said ring-receiving plate includes a number of cavity means, each adapted to receive and position a respective ring means about its respective pair of pins.

11. A connector array adapted for detachable ohmic connection of a set of first pins projected from a base device with respective ones of a set of second pins projected oppositely from one or more connectable devices, this connector array characterized by a stack of non-conductive plate means, each having an array of two-pin bores, these bores arrayed across each plate seems to register as multi-plate two pin bore-columns, with one such bore-column for each respective pair of pins, being cut to receive its respective pair of oppositely-projected pins; plus an array of conductive gripper means, one for urging each pin pair into wiping engagement; with adjacent gripper means being offset from one another in the thickness direction of the connector plate means.

12. A method of providing female connector means adapted for connecting a first set of pins projected from a base device B, with respective ones of second pins projected oppositely from one or more connectable devices, this method comprising:

providing connector means which is characterized by paired bores for respective connecting pairs of said pins, each bore being cut to receive a respective pair of oppositely-projected pins in wiping engagement;

and providing an associated array of conductive gripper means, each gripper means being selected and adapted for so engaging a respective pair of said pins; said connector means further including a plurality of relatively planar plates adapted to receive and retain said gripper means.

13. A connector array adapted for detachable ohmic connection of a first set of pins projected from a base device with respective ones of a set of second pins projected oppositely from one or more connectable devices; this connector array being characterized by at least two non-conductive planar matrices, each matrix having a like spaced array of two-pin bores, one bore for each respective pair of pins, each bore being cut and placed to receive a respective pair of oppositely-projected pins; and the combination therewith of a number of conductive gripper means, one for urging each pin pair into wiping ohmic-conductive engagement; each gripper means comprising at least one relatively resilient conductive segment adapted to urge one pin against the other.

14. The invention of claim 13, wherein each said gripper means is formed to comprise at least one resilient conductor segment shaped and adapted to resiliently urge its given pair of pins toward one another.

15. The invention of claim 13, wherein adjacent gripper means are offset from one another in the thickness direction of the connector matrix.

16. The invention of claim 13, wherein each gripper means comprises two or more resilient conductive segments adapted to surround a given pair of pins, at least partially, each gripper means being adapted to thrust its pins toward on another.

17. The invention of claim 16, wherein said bores and pin pairs are set relatively closely together and the length of each said gripper means is adapted to extend around one or more adjacent pin pairs without touching other pin pairs.

18. The invention of claim 16, wherein adjacent gripper means are offset from one another in the thickness direction of the connector matrix.

19. A method of providing a connector array adapted for detachable ohmic connection of a first set of pins projected from a base device with respective ones of a set of second pins projected oppositely from one or more connectable devices, this method comprising:

providing a connector array which is characterized by at least two non-conductive planar matrices, and with each said matrix having a like spaced array of two-pin bores, one bore for each respective pair of pins;

cutting and disposing each said bore to receive a respective pair of oppositely-projected pins; and selecting and combining therewith a number of conductive gripper means, one for urging each pin pair into wiping ohmic-conductive engagement; each gripper means being selected and arranged to comprise at least one relatively resilient conductive segment adapted to urge one pin against the other.

20. The method of claim 19, wherein each said gripper means is formed to comprise at least one resilient conductor segment shaped and adapted to resiliently urge its given pair of pins toward one another.

21. The method of claim 19, wherein adjacent ones of said gripper means are offset from one another in the thickness direction of the connector matrix.

22. The method of claim 19, wherein each said gripper means is selected and arranged to comprise two or more resilient conductive segments adapted to surround a given pair of pins, at least partially, each said gripper means being adapted to thrust its toward on another.

23. The method of claim 22, wherein said bores and pin pairs are set relatively closely together and the length of each said gripper means is adapted to extend around one or more adjacent pin pairs without touching other pin pairs.

24. The method of claim 22, wherein adjacent gripper means are offset from one another in the thickness direction of the connector matrix.

* * * * *